US011451228B2

(12) United States Patent
Hélot et al.

(10) Patent No.: US 11,451,228 B2
(45) Date of Patent: Sep. 20, 2022

(54) OPERATING DEVICE FOR A MOTOR VEHICLE, METHOD FOR OPERATING A MOTOR VEHICLE WITH THE AID OF THE OPERATING DEVICE, CONTROL UNIT, AND MOTOR VEHICLE

(71) Applicant: AUDI AG, Ingolstadt (DE)

(72) Inventors: Jacques Hélot, Ingolstadt (DE); Joris Mertens, Ingolstadt (DE); Maximilian Mitwalsky, Ingolstadt (DE); Clemens Volz, Kipfenberg-Biberg (DE); Günther Seitz, Kösching (DE); Ulrich Müller, Ingolstadt (DE); Tobias Hopf, Landshut (DE)

(73) Assignee: Audi AG, Ingolstadt (DE)

( * ) Notice: Subject to any disclaimer, the term of this patent is extended or adjusted under 35 U.S.C. 154(b) by 404 days.

(21) Appl. No.: 16/628,751

(22) PCT Filed: Jun. 25, 2018

(86) PCT No.: PCT/EP2018/066969
§ 371 (c)(1),
(2) Date: Jan. 6, 2020

(87) PCT Pub. No.: WO2019/007743
PCT Pub. Date: Jan. 10, 2019

(65) Prior Publication Data
US 2020/0282836 A1    Sep. 10, 2020

(30) Foreign Application Priority Data

Jul. 6, 2017   (DE) .................... 10 2017 211 525.4

(51) Int. Cl.
*H03K 17/96* (2006.01)
*B60K 37/06* (2006.01)
*G06F 3/044* (2006.01)

(52) U.S. Cl.
CPC ......... *H03K 17/9622* (2013.01); *B60K 37/06* (2013.01); *G06F 3/0446* (2019.05);
(Continued)

(58) Field of Classification Search
CPC ............ H03K 17/9622; H03K 17/962; H03K 2217/9607; G06F 3/0446; G06F 3/0447; B60K 2370/143
See application file for complete search history.

(56) References Cited

U.S. PATENT DOCUMENTS 9,164,530 B2 * 10/2015 Kandler ................... G05G 1/10
9,811,200 B2 * 11/2017 Lee .......................... B60T 7/085
(Continued)

FOREIGN PATENT DOCUMENTS

DE    102009030592 A1    12/2010
DE    102010010574 A1    9/2011
(Continued)

OTHER PUBLICATIONS

Notification of Transmittal of Translation of the International Preliminary Report on Patentability dated Jan. 9, 2020, in connection with corresponding international Application No. PCT/EP2018/066969 (9 pgs.).

(Continued)

*Primary Examiner* — Kyung S Lee
(74) *Attorney, Agent, or Firm* — Maier & Maier, PLLC

(57) ABSTRACT

An operating device for a motor vehicle, having a touch-sensitive operating element with a frame element and a central region. The touch-sensitive operating interface has a predetermined operating region at each of at least two predetermined touch positions for activating an operating function assigned to the respective operating region. The operating element is arranged to be displaceable at least partially along a translation axis that intersects the operating (Continued)

interface. The operating device has only one detection element, which is arranged facing an inner side of the touch-sensitive operating element that faces away from the touch-sensitive operating interface, and which is arranged to detect a displacement of each operating region along the translation axis.

12 Claims, 3 Drawing Sheets

(52) U.S. Cl.
CPC ......... *G06F 3/0447* (2019.05); *H03K 17/962* (2013.01); *B60K 2370/128* (2019.05); *B60K 2370/143* (2019.05); *B60K 2370/146* (2019.05); *B60K 2370/1468* (2019.05); *H03K 2217/9607* (2013.01)

(56) References Cited

U.S. PATENT DOCUMENTS

| | | | | |
|---|---|---|---|---|
| 2008/0030361 | A1* | 2/2008 | Peissner | B60K 37/06 340/691.6 |
| 2008/0202898 | A1* | 8/2008 | Cheon | H01H 25/041 200/18 |
| 2010/0060568 | A1* | 3/2010 | Fisher | H03K 17/9622 345/156 |
| 2012/0279844 | A1* | 11/2012 | Wang | H03K 17/96 200/600 |
| 2013/0001058 | A1* | 1/2013 | Bowler | H03K 17/962 200/600 |
| 2014/0252882 | A1* | 9/2014 | Dinh | H01H 13/88 29/622 |
| 2015/0041292 | A1* | 2/2015 | Sugiura | H01H 13/14 200/17 R |
| 2015/0130752 | A1* | 5/2015 | Sumi | H05B 6/6435 345/174 |
| 2017/0269768 | A1* | 9/2017 | Shin | B60K 35/00 |

FOREIGN PATENT DOCUMENTS

| | | |
|---|---|---|
| DE | 102010042376 A1 | 12/2011 |
| DE | 102011114051 A1 | 3/2013 |
| DE | 102014019006 A1 | 6/2016 |
| DE | 102015003204 A1 | 9/2016 |
| DE | 102016206719 A1 | 11/2016 |
| DE | 102016206014 A1 | 3/2017 |
| WO | 2007/064432 A2 | 6/2007 |
| WO | 2008/113542 A1 | 9/2008 |
| WO | 2017/001032 A1 | 1/2017 |
| WO | 2017/020975 A1 | 2/2017 |

OTHER PUBLICATIONS

German Examination Report dated Nov. 10, 2021, in connection with corresponding German Application No. 10 2017 211 525.4 (10 pp., including machine-generated English translation).
International Search Report with English translation and Written Opinion with Machine translation dated Oct. 2, 2018 in corresponding International Application No. PCT/EP2018/066969; 19 pages.
International Preliminary Report on Patentability dated Oct. 8, 2019 in corresponding International Application No. PCT/EP2018/066969; 31 pages; Machine translation attached.

* cited by examiner

OPERATING DEVICE FOR A MOTOR VEHICLE, METHOD FOR OPERATING A MOTOR VEHICLE WITH THE AID OF THE OPERATING DEVICE, CONTROL UNIT, AND MOTOR VEHICLE

FIELD

The invention relates to an operating device for a motor vehicle, said operating device having a touch-sensitive operating element with a frame element and a central region, wherein the frame element has a touch-sensitive operating interface and at least partially or completely frames the central region.

BACKGROUND

Motor vehicle systems and operating functions of the motor vehicle systems are being provided in motor vehicle operating devices with increasing number and variations in order to operate the devices or device components. Such operating devices have operating elements, i.e. components for receiving an operating action of a user of the motor vehicle, wherein an operating element may be designed, for example, as a button or switch or touch-sensitive screen. In some operating functions, it may be provided that the user can set a target value of a control parameter, for example the volume level of a radio or a temperature to be set by means of a climate-control system.

A classic volume control is designed as a rotary knob, wherein a turn into one direction can trigger an increase in the volume level and a turn in an opposite direction can trigger a decrease in the loudness level. Alternatively, such an exemplary volume control may be designed as a slide control (slider), for example as a slide control displayed on a touch-sensitive screen (touch display). In a different design from the prior art, a volume control may be designed as a capacitive, linear slide control in a dashboard.

A classic volume control can be operated intuitively; however, it is an additive, i.e. additional, element and goes against the trend of representing designs that are as gapless and flush as possible. Due to an increasing number of possible operating functions, however, an increasing number of rotary knobs is necessary in the event these operating functions are not operated, for example, via a touch-sensitive screen or speech recognition, wherein an operating function can be assigned to each rotary knob.

With a volume control displayed on a touch-sensitive screen in the form of a slide control, there is the disadvantage that it is difficult to operate, because the user must be able to see the screen in order to reach the slide control and not slide away from a display field displaying the slide control when adjusting the volume or the temperature. Such a slide control takes up a lot of space on the screen, especially for further extra functions. If such a slide control is located on a second menu level, it takes even longer to operate. In addition, a sliding movement on the screen may be ergonomically difficult.

A capacitive slide control is likewise difficult to operate by means of a linear movement, because the finger can slide off in this case. Poor operability results due to a small operating surface. Such a capacitive slide control takes up a lot of space for extra functions and, with an equalization of the linear slide control, such a slide control is difficult to accommodate in practical use, for example, in a center console.

DE 10 2011 114 051 A1 describes an operating device with at least one rotatable and pressable component, wherein said component is provided with at least one touch-sensitive input and/or display surface.

DE 10 2010 042 376 A1 discloses a display and input device for a motor vehicle, wherein a touch-sensitive screen can display several functions and pieces of information. A target value of a function can be adjusted by means of a physical input unit.

DE 10 2010 010 574 A1 describes an operating device for a vehicle, which comprises a touch-sensitive interface and an adjusting element.

In addition, a supportable, digital media player (iPod nano) is known from the prior art, which has a circular operating element with several micro buttons.

The aforementioned operating elements from the prior art either do not eliminate the aforementioned disadvantages or only do so up to a certain degree satisfactorily.

SUMMARY

An object upon which the invention is based is the simplifying of an operation of several operating functions while saving installation space.

The presented object is achieved by the devices according to the invention with the method according to the invention.

The invention is based on the idea to mount a touch-sensitive operating element on only one detection element, wherein a change in a value of a control parameter or of a target value of the operating function is enabled by means of a touch-sensitive sensor system, as well as the triggering of several additional functions by means of the detection element. The detection element in this case is understood to be a component or a component combination for pressure-sensory and/or contact-sensory and/or capacitive sensing of an operating action. The detection element in this case may be designed, for example, as a straight key and/or micro button.

The operating device according to the invention for a motor vehicle has a touch-sensitive operating element with a frame element and a central region, wherein the frame element has a touch-sensitive operating interface and at least partially or completely frames the central region. The touch-sensitive operating interface has a predefined operating region at at least two predefined touch positions in order to activate an operating function assigned to the respective operating region. In other words, one operating function is assigned to each operating region and thus to each touch position. The operating element in this case is arranged to be displaceable or moveable at least partially along a translation axis that intersects the operating interface, i.e. it can be pressed, for example, into an optional housing of the operating device or into an interior trim element.

The operating device is characterized in that it has only one detection element, which is arranged facing an inner side of the touch-sensitive operating element that faces away from the touch-sensitive operating interface, and which is arranged to detect a displacement of each operating region along the translation axis. If the operating element is arranged, for example, in a housing of the operating device or in a housing of an interior trim element, the touch-sensitive operating interface is aligned outward such that the user can touch it, while the single detection element is arranged in the housing or in the interior trim element, i.e. underneath in the touch-sensitive operating element, for example.

In other words, the touch-sensitive operating element and the detection element form a further, for example pressure-sensitive and/or capacitive, operating element.

Advantageously, this results in very good operability and extensive flexibility, verification on the functional sample, and faulty triggering is practically excluded. In addition, during displacement or movement of the touch-sensitive operating element along the translation axis, haptic feedback is provided, for example for operating functions of a media player such as, for example, "Skip" (skip a song), "Mute", and/or "On/Off". The operating device requires very little installation space and can be arranged compactly, for example, in a center console. This compactness results in improved crash safety and a lower risk of damage in a crash test in which a large amount of weight is allowed to fall onto the center console. This also results in a reduction of the risk of injury.

A further advantage is a modern and appealing design due to the compactness. Due to the arrangement of the detection element, only a single detection element is necessary, whereby a quantity of components is reduced. Production costs are also thereby reduced. The operating element also does not protrude from a surface, for example, of the center console.

For example, the detection element may be designed as a pressure sensor and/or micro button and/or contact sensor.

According to an especially preferred embodiment, the detection element may be arranged at least partially facing the central region; preferably in this case, the detection element may be arranged centered or practically centered with respect to the central region. For example, pressing of each operating region, as well as of the central region, can thereby take place equally reliably.

According to a further embodiment of the operating device, the frame element may have a sensing web designed as a material sink for guiding an object and/or a body part along the movement path. As a result, an intuitive operation is promoted, and thus driving safety increases.

In addition to the detection element and the touch-sensitive operating element, the operating device may have a ring element at least partially surrounding the frame element, which can preferably frame the frame element. In this manner, additional guidance of an object and/or a body part for performing an operating action can be performed, for example guidance for a user's finger or a stylus.

According to a particularly preferred embodiment of the operating device according to the invention, the frame element can be arranged or designed countersunk in relation to the central region, preferably wherein the frame element can be designed to extend conically toward the central region. In other words, the frame element can be designed as a chamfer. As a result, guidance of the object and/or body part for performing the operating action is further promoted and the user can better orient themselves. As a result, an intuitive blind operation is further promoted, whereby driving safety is increased.

The previously presented object is achieved by means of a method for operating a motor vehicle with the aid of an embodiment of the operating device according to the invention. The method has the following steps performed by a control unit, wherein the control unit may preferably be a control unit of the operating device. In this case, a control unit is understood to be a component, device, or device component which is/are configured to receive, evaluate, and generate signals and, for example, can be designed as a control chip, control board, or control device.

First of all, an operating action is detected, which is executed on the touch-sensitive operating interface of the operating element.

If, as an operating action, a swipe or movement of an object and/or body part along a movement path is detected over at least two of the operating regions of the operating interface, i.e., if, for example, a swipe or swipe gesture is detected on the touch-sensitive operating interface, there is an activating of a first operating function, preferably a volume control, assigned to the frame element and a setting of a target value of a control parameter predetermined by the activated operating function as a function of a direction of the detected operating action on the movement path and/or as a function of a length of a travel distance on the movement path, which is predetermined by the operating action. In other words, for example, a volume can be increased or decreased, for example, if the user swipes clockwise or counterclockwise with an exemplary circular frame element. Alternatively, the operating function assigned to the frame element can be, for example, a climate control or climate regulation, a setting of a light, wherein the operating element can be configured as a light switch, or an adjustment of a mirror.

If contact with the touch-sensitive operating interface is detected as an operating action at only one of the at least two touch positions—in other words, if touching only one of the operating regions is detected as an operating action—predetermining of a further operating function assigned to the touched touch position, i.e. the operating region, takes place. This is followed by detecting a further operating action by the detection element, which describes a displacement or movement of the operating region and/or of the operating element along the translation axis intersecting the operating interface, and, depending on the displacement or movement detected by the detection element along the translation axis, a triggering the predetermined operating function. In other words, by means of, for example, a lingering of the object and/or body part on the touch position or on the operating region, a corresponding operating function predefined for the respective operating region is predetermined, which can then be triggered, for example, by pressing the operating region or the entire frame element.

This results in the aforementioned advantages.

The previously presented object is achieved by means of a control unit according to the invention, which is characterized in that the control unit is configured to execute an embodiment of the method according to the invention. The previously mentioned advantages also result in this case. Preferably, the control unit may be designed as a control board or control device. Ideally, the control unit may have a processor device, that is a component or a device component for electronic data processing, which may preferably have at least one microcontroller and/or at least one microprocessor. Preferably, the processor device may be configured to execute a program code stored in a data memory, wherein the program code may be configured to prompt the control unit, when executed by the processor device, to carry out the method according to the invention.

The aforementioned object is achieved by means of an operating device in accordance with one of the previously described embodiments, which is characterized in that it has an embodiment of the control unit according to the invention.

The aforementioned object is achieved by means of a motor vehicle, which may be designed, for example, as a car, for example as a passenger car. The motor vehicle is characterized by an embodiment of the operating device according to the invention and/or an embodiment of the control unit according to the invention.

The invention also includes refinements of the method according to the invention, which have features as they have already been described in association with the refinements of the motor vehicle according to the invention. For this reason, the corresponding refinements of the method according to the invention are not described again here.

BRIEF DESCRIPTION OF THE DRAWINGS

Exemplary embodiments of the invention are described in the following. The following is shown.

DETAILED DESCRIPTION

Figure 1:
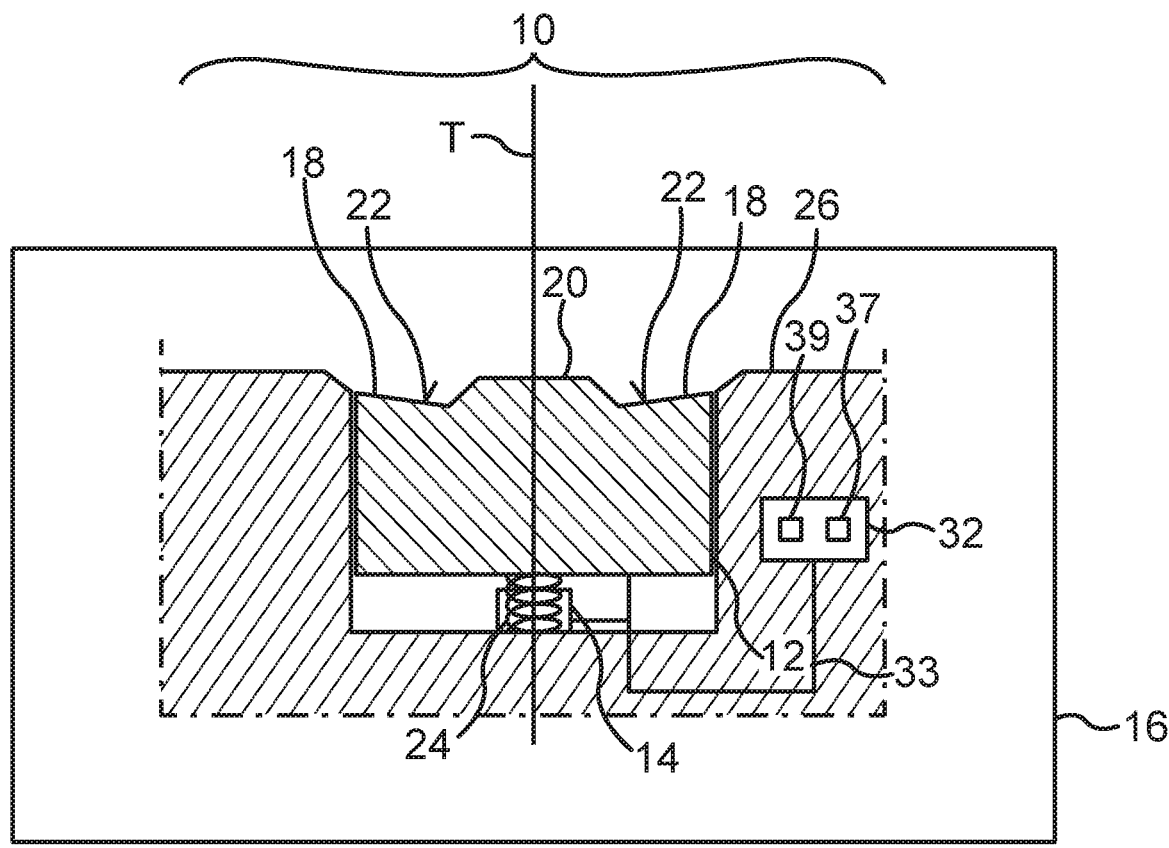
FIG. 1 a schematic view of a first exemplary embodiment of the operating device according to the invention in cross-section.

The exemplary embodiments explained in the following refer to preferred embodiments of the invention. With the exemplary embodiments, the described components of the embodiments represent individual features of the invention that are to be considered independently of one another, each of which also further develop the invention independently of one another and thus also are to be considered individually or in a combination that is different than the one shown as a component of the invention. Furthermore, the described embodiments can also be supplemented through further described features of the invention.

In the figures, elements which are functionally equivalent are each given the same reference numerals.

FIG. 1 illustrates the principle of the operating device according to the invention 10, shown schematically and in cross-section in FIG. 1, by means of a first embodiment. The operating device 10 can optionally have a housing in which a touch-sensitive operating element 12 and the detection element 14 can be arranged. Alternatively, the combination of detection element 14 and touch-sensitive operating element 12 can be designated as the operating device.

The operating device 10 in FIG. 1 is shown as an example in a motor vehicle 16, for example a car, wherein the operating device 10 for example, may be arranged in a center console and configured to operate an infotainment system.

The touch-sensitive operating element 12 has a frame element 18 and a central region 20, wherein the frame element 18 in the example from FIG. 1 may be arranged circularly around the central region 20.

A touch-sensitive operating interface 22 of the touch-sensitive operating element 12 extends over the frame element 18, wherein optionally also the central region 20 may have a touch-sensitive operating interface 22.

Figure 2:
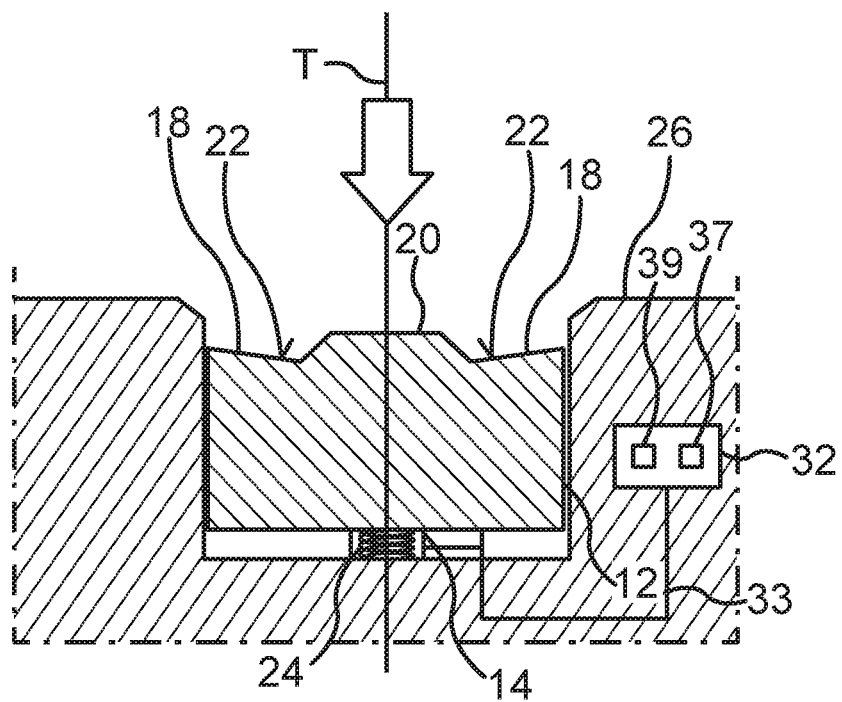
FIG. 2 a schematic view of a further exemplary embodiment of the operating device according to the invention in cross-section.

FIG. 1 also shows the translation axis T, along which the operating element, for example due to one of the operating regions of the touch-sensitive operating interface 22 being pressed, for example, can be pushed down (see FIG. 2, in which the movement is indicated by the arrow).

The detection element 14 may preferably be arranged centered or slightly offset facing the central region 20, which, in the example of FIG. 1, may correspond to an operating device 10 installed in a center console under the operating element 12 and at least partially below the central region 20. The detection element 14 may preferably be designed as a micro button.

Touch-sensitive operating interfaces 22 are known to those skilled in the art as capacitive surfaces. The operating element 12 may be mounted by example as a key and arranged by example over an optional spring element 24, through which the operating element 12 can be sprung back into its original position, for example, after being pressed.

The central region 20, for example, may be a non-capacitive surface, which may optionally be connected to the frame element 18. Alternatively, the central region 20 may also be designed as a separate component. Optionally, an additional operating function may be assigned to the central region 20, which, for example, can be activated and/or triggered by touching the touch-sensitive central region 20.

Additionally or alternatively, the operating element 12 may not have a separate central region 20, that is, the frame element 18 can seamlessly transition to the central region.

As an alternative to the exemplary arrangement in the center console, the operating device 10, for example, may be rotated 90° and arranged in a dashboard, such that the translation axis T may extend parallel or substantially parallel to a motor vehicle longitudinal direction, for example. In this case, the detection element 14 is not arranged under the operating element 12 in the installed state, but instead behind the operating element 12 from the user's perspective. Alternatively, the operating device 10, for example, may be arranged in a door of the motor vehicle 10 or arranged on a motor vehicle seat and be configured, for example, for adjusting a mirror and/or adjusting the motor vehicle seat.

A capacitive electronic system of the touch-sensitive operating interface 22 may be arranged, for example, in the center console or in a housing or in an optional ring element 26 and connected to the touch-sensitive operating interface 22, for example, with the aid of a cable. The exemplary cable, for example, may extend along a motor vehicle vertical axis and then move upon a movement of the optional spring element 24 and be inserted, for example, in a slot of a bezel.

The operating element 12 and/or the ring element 26 may be made of material known to one skilled in the art, for example, plastic or glass. The ring element 26 may be designed, for example, from wood and/or aluminum. The touch-sensitive operating interface 22 and/or a surface of the ring element 26 may be designed in black color, for example. Optional symbols on the frame element 18 can be lit, for example. Alternatively or additionally, the ring element 26 may be designed as an illuminated ring.

FIG. 1 also shows an optional control unit 32, which can be connected to the operating element 12 and the detection element 14 with the aid of a data communication connection 33, for example a wire or a cable, or a wireless data communication connection 33. The optional control unit 32 may optionally have a processor device 37 with, for example, several microprocessors, and/or a data memory 39, which may be designed, for example, as a memory card or memory chip.

FIG. 2 shows an operating device 10, which may be designed, for example, like the operating device 10 from FIG. 1. FIG. 2 in this case, as already described above, shows the displacement of the operating element 12 along the translation axis T the direction of the arrow.

In an exemplary pressing of the operating element 12 and/or of the frame element 18 and/or of the central region 20, a movement, i.e. the displacement, can be executed straight down, as exemplified in FIG. 2, or laterally offset. In other words, a sliding or tilting of the frame element 18 or of the operating element 12 can be detected by the detection element 14.

Figure 3:
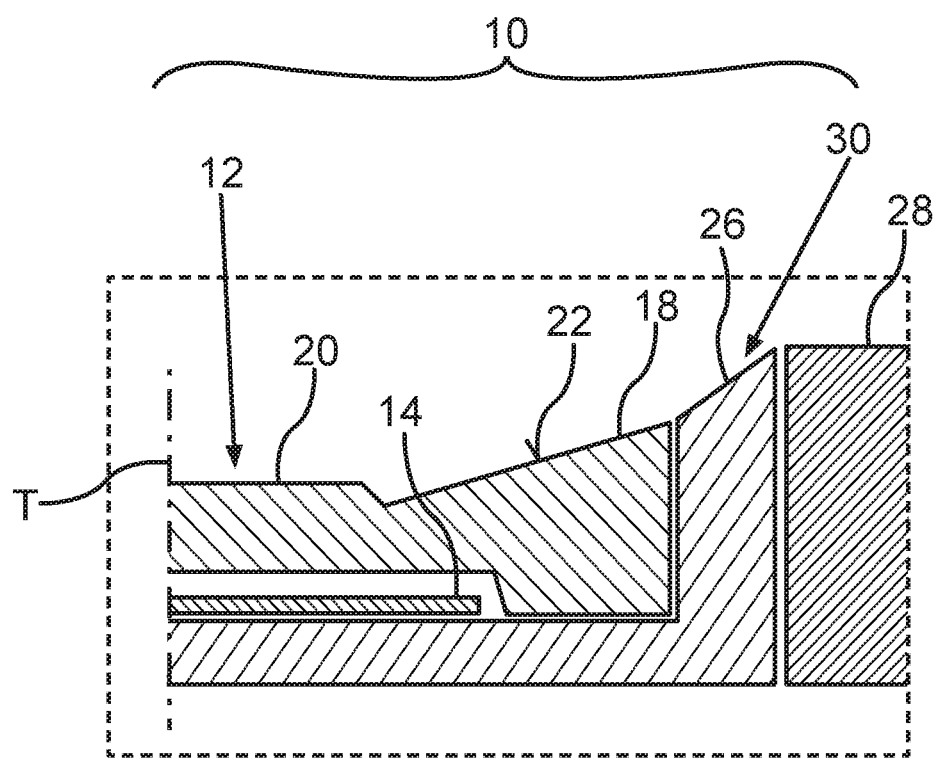
FIG. 3 a schematic view of a further exemplary embodiment of the operating device according to the invention in cross-section.

FIG. 3 shows a further exemplary embodiment of the operating device 10 according to the invention. This exemplary embodiment may be arranged in an exemplary center console 28. The frame element 18 and the central region 20 can be durably connected to one another. The ring element 26 may be designed, for example, as a wall or housing element. The frame element 18 may be countersunk slightly conically offset in the ring element 26, wherein the countersunk region of the frame element 18 opposite a protruding edge of the central region 20 can form the sensing web. A transition to the exemplary center console 28 can take place, for example, via a chamfer 30, which can also support guidance of a finger of the user. The conical recess and the chamfer reduce in this case the likelihood of incorrect operation.

An exemplary diameter of the central region 20 may be, for example, in a range of from 5 mm to 20 mm, for example, a diameter of 12 mm. A diameter of the frame element 18 may be, for example, 32 mm, and an exemplary diameter of the ring element 26 may be, for example, 36 mm.

Figure 4:
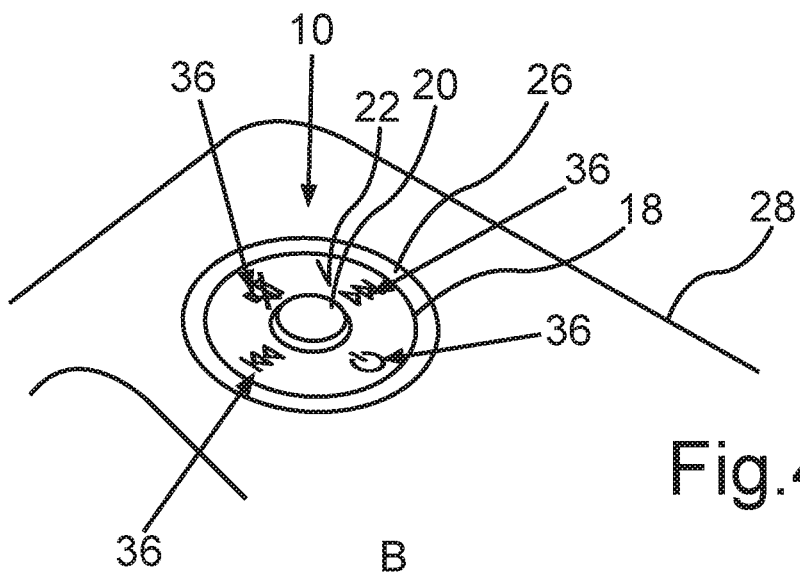
FIG. 4 a schematic, three-dimensional view of a further exemplary embodiment of the operating device according to the invention.

FIG. 4 shows an embodiment of the operating device 10 according to the invention, wherein only the differences are discussed in the following.

In this example, a three-dimensional view can be seen at an angle from above.

FIG. 4 illustrates a circular design of the frame element 18 around a circular central region 20, which may be completely framed by the frame element 18. The frame element 18 may have different shapes, for example a round, semicircular, oval, squared, curved, or S-shaped form. Alternative embodiments may provide, for example, a linear, rectangular, triangular, otherwise polygonal, or elongated frame element 18. The operating element 12 may alternatively have a flat or conically raised surface.

The illustration from FIG. 4 exemplifies four operating regions 36, wherein, in the example from FIG. 4, each of the operating regions 36 may show a symbol for identifying the operating function assigned by the corresponding operating region 36. One of the functions may be, for example, a "mute" function, i.e. a muting of a speaker, a jump back or skip in the playlist, and/or a switch-off of the exemplary speaker. Alternatively, the operating device 10 may be provided, for example, for controlling ventilation and/or for setting a temperature by means of a climate-control system and/or as a light switch and/or as a mirror adjuster and/or as a seat adjuster and/or as a switch for a lamp in the interior.

Figure 5:
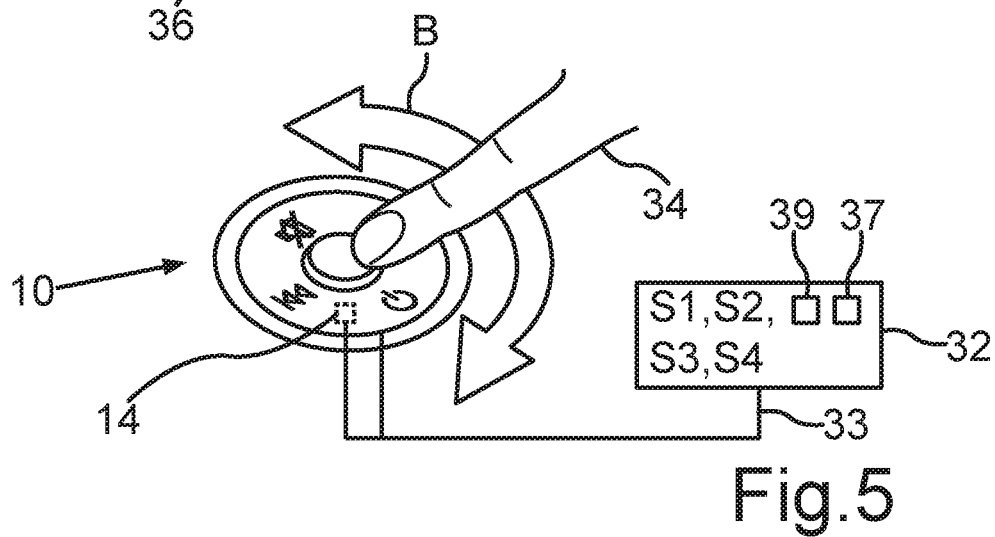
FIG. 5 a schematic view of an exemplary embodiment of the method according to the invention.
Figure 6:
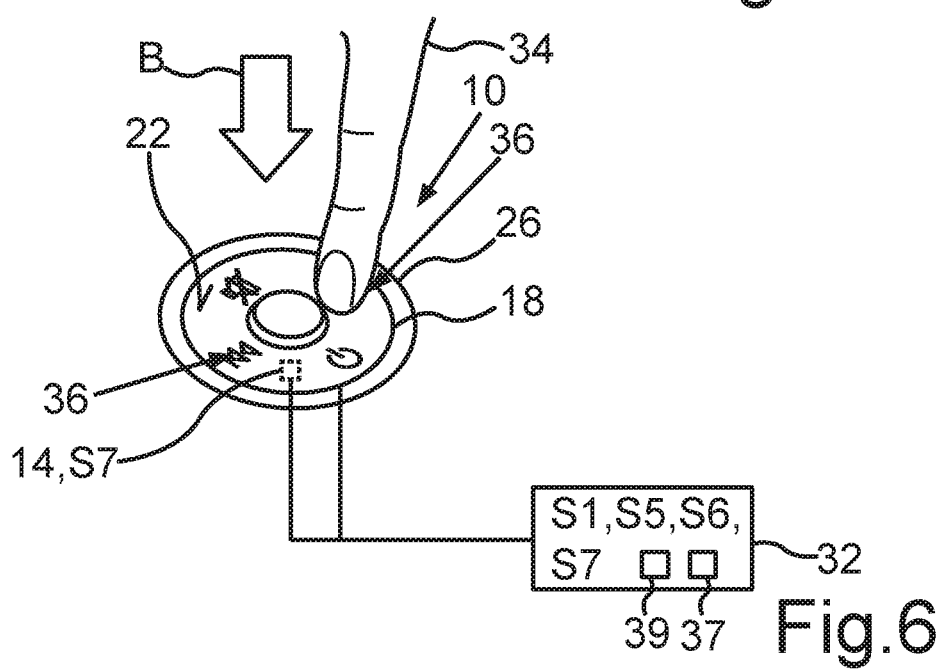
FIG. 6 a schematic view of a further exemplary embodiment of the method according to the invention.

FIGS. 5 and 6 schematically illustrate an embodiment of the method according to the invention, which can be executed, for example, by means of a further previously described exemplary embodiment of operating device 10 according to the invention. For the sake of clarity in this case, the motor vehicle 16 is not shown in FIGS. 5 and 6, and not all features have been provided with reference numerals.

FIG. 5 shows a body part 34 of the user, an exemplary finger. Alternatively, a user can use a stylus, for example, to operate the operating device 10.

In a first method step S1, the control unit 32 detects an operating action for setting a target value (S3), said operating action possibly being a sweep or swipe of the body part 34 along the frame element 18 in the example from FIG. 5, wherein different possible directions of movement of a corresponding movement path are illustrated by the arrow B. For example, it may be provided that counterclockwise swiping reduces the exemplary volume and clockwise swiping increases a volume.

The exemplary volume control can be activated as a first operating function with an electronics system known to one skilled in the art for the digital detection of the operating action on the touch-sensitive operating interface (S2). The control unit can generate a corresponding control signal by means of the distance traveled by the body part 34 and the direction of movement executed, and this control signal, which may describe the target value to be set, can be transmitted to the speaker or the radio (S4).

In the example from FIG. 6, the sensory operating interface 22 can detect (S4), for example, that the body part 34 is lingering for a longer time at a touch position on one of the operating regions 36, which may be associated, for example, with a selection of a song that follows in a playlist.

When such an operating action is detected (S1), the operating function of selecting the next song can be predetermined (S5). Another operating action, for example pressing the operating element 12 downward, can be detected by the control unit 32 in method step S6. To this end, the detection element 14 can initially receive (S7) this further operating action and transfer a corresponding signal to the control unit 32 for detecting the operating action (S6). Depending on the detected further operating action, the predetermined operating function can then be triggered (S7); this means that the song currently being played is interrupted and the next song is played.

Overall, the exemplary embodiments illustrate how, for example, a circular volume control, as an operating device 10, which is mounted on the detection element 14, is provided with additional functions by the invention, wherein the detection element 14 may be designed, for example, as a straight key or micro button.

According to a further exemplary embodiment, the exemplary volume control with related functions ("On/Off", "Skip right/left", "Mute") may be designed, for example, as a circular, capacitive touchscreen 22, wherein it is, in turn, mounted translationally.

If the body part 34, the exemplary finger, is moved, for example, circularly along the round, touch-sensitive operating interface 22 for example, the volume can be adjusted, for example. For example, by pressing one of the symbols, i.e. one of the operating regions 36, the operating interface 22 can be moved translationally, for example, downward, and by activating the detection element 14, for example a micro button, the function can be triggered. By means of capacitive position detection, it is possible to differentiate among the different operating functions, which can also be characterized as a "tapping function". This reduces incorrect operation. The aforementioned advantages result.

The invention claimed is:

1. An operating device for a motor vehicle, comprising: a touch-sensitive operating element with a frame element and a central region, and precisely one detection element, wherein the frame element has a touch-sensitive operating interface, at least partially frames the central region, and extends conically towards the central region, wherein the touch-sensitive operating interface has at least two predetermined operating regions corresponding to touch positions arranged about the touch-sensitive operating interface for activating an operating function assigned to a respective operating region, wherein the touch-sensitive operating element is displaceable at least partially along a translation axis that intersects the touch-sensitive operating interface, wherein the detection element is arranged facing an inner side of the touch-sensitive operating element which faces away from the touch-sensitive operating interface, wherein the detection element is configured to detect a displacement of the touch-sensitive operating element along the translation axis, wherein a first operation is activated in response to a first operating action, the first operating action comprising a detected movement of an object across two or more of the at least two predetermined operating regions, and wherein a second operation is activated in response to a second operating action, the second operating action comprising (1) a detected presence of the object on one of the at least two predetermined operating regions and (2) displacement of the touch-sensitive operating element along the translation axis.

2. The operating device according to claim 1, wherein the detection element comprises at least one of a pressure sensor, a micro button, and a contact sensor.

3. The operating device according to claim 2, wherein the detection element is arranged centered with respect to the central region.

4. The operating device according to claim 1, wherein the frame element has a sensing web designed as a depression for guiding the object along a movement path.

5. The operating device according to claim 1, further comprising a ring element which at least partially surrounds the frame element.

6. The operating device according to claim 5, wherein the frame element is countersunk relative to the ring element.

7. The operating device according to claim 1, further comprising a control unit which is configured to execute the first and second operations, wherein, through the first operation, the control unit sets a target value of a predetermined control parameter as a function of at least one of a direction of movement of the object and a travel distance of the object across the touch-sensitive operating interface, and wherein, through the second operation, the control unit triggers the operating function corresponding to the one of the at least two operating regions which was pressed.

8. The operating device according to claim 1, wherein the central region is a non-capacitive surface connected to the frame element.

9. The operating device according to claim 1, wherein the central region is separate from the frame element.

10. The operating device according to claim 1, wherein the central region is touch-sensitive, and wherein a third operation is activated in response to a third operating action, the third operating action comprising a detected touching or pressing of the central region by the object.

11. The operating device according to claim 1, wherein the object is at least one of a stylus and a finger of a user.

12. A method for operating a motor vehicle comprising an operating device, the method comprising:

detecting at least one of a plurality of operating actions which are executable on a touch-sensitive operating interface of an operating element;

wherein the touch-sensitive operating interface has at least two predetermined operating regions corresponding to touch positions arranged about the touch-sensitive operating interface for activating an operating function assigned to a respective operating region, wherein the operating device comprises precisely one detection element for detecting a displacement of the touch-sensitive operating interface along a translation axis, wherein a first of the plurality of operating actions comprises movement of an object across two or more of the at least two predetermined operating regions, and wherein a second of the plurality of operating actions comprises (1) presence of the object on one of the at least two predetermined operating regions and (2) displacement of the touch-sensitive operating interface along the translation axis.

* * * * *